(12) United States Patent
Grant et al.

(10) Patent No.: US 6,912,134 B2
(45) Date of Patent: Jun. 28, 2005

(54) FAN CONTROL CIRCUIT AND PACKAGE

(75) Inventors: William R. Grant, Fountain Valley, CA (US); Sergio Fissore, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 28 days.

(21) Appl. No.: 09/949,764

(22) Filed: Sep. 12, 2001

(65) Prior Publication Data

US 2002/0030977 A1 Mar. 14, 2002

Related U.S. Application Data

(60) Provisional application No. 60/232,086, filed on Sep. 12, 2000.

(51) Int. Cl.$^7$ ............................. H05K 7/02; H05K 7/06; H05K 7/08; H05K 7/10
(52) U.S. Cl. ...................... 361/760; 361/361; 361/813; 257/666
(58) Field of Search ................................. 361/760–761, 361/813, 785–790; 257/666, 692–695, 700–704, 723–724, 98–100; 310/68 R

(56) References Cited

U.S. PATENT DOCUMENTS

| | | | | |
|---|---|---|---|---|
| 4,677,528 A | * | 6/1987 | Miniet | 361/751 |
| 5,521,437 A | * | 5/1996 | Oshima et al. | 257/701 |
| 5,723,363 A | * | 3/1998 | Wiese | 438/107 |
| 5,767,573 A | * | 6/1998 | Noda et al. | 257/675 |
| 5,895,974 A | * | 4/1999 | Eytcheson et al. | 257/723 |
| 5,986,317 A | * | 11/1999 | Wiese | 257/433 |
| 6,201,696 B1 | * | 3/2001 | Shimizu et al. | 361/704 |
| 6,297,549 B1 | * | 10/2001 | Hiyoshi | 257/703 |
| 6,313,598 B1 | * | 11/2001 | Tamba et al. | 318/722 |
| 6,441,520 B1 | * | 8/2002 | Grant | 310/68 R |

* cited by examiner

Primary Examiner—Kamand Cuneo
Assistant Examiner—Tuan Dinh
(74) Attorney, Agent, or Firm—Ostrolenk, Faber, Gerb & Soffen, LLP

(57) ABSTRACT

A dual output power module housing a dual output power circuit for providing variable power to two parallel connected fan motors is shown. The power module includes a pad which has disposed thereon two power switching devices, two intelligent power switches, and a power circuit board on which circuits for controlling the intelligent power switches are disposed. The module includes a power shell that surrounds the dual output power circuit, and a resilient, flexible enclosure which encapsulates the power shell and the circuit components within the power shell.

10 Claims, 9 Drawing Sheets

FAN CONTROL CIRCUIT AND PACKAGE

This application claims priority to U.S. Provisional Application No. 60/232,086, filed on Sep. 12, 2000.

BACKGROUND OF THE INVENTION

1. Field of the Invention

This application relates to power modules and, more specifically, to a fan control power module for automotive use.

2. Description of the Related Art

Radiators in modern automobiles are typically cooled using two independently controllable fans. The motors that run the fans are controlled using fan control circuits. These fan control circuits are large and relatively complex and can be difficult to mount, troubleshoot or replace.

It is, therefore, desirable to provide a simplified fan control circuit and a module type housing that is small, inexpensive, easy to install and remove, and capable of withstanding the harsh environment in an automobile engine to ensure reliable operation.

SUMMARY OF THE INVENTION

In accordance with one aspect of the invention, a dual output power circuit is packaged in a power module. The dual output power circuit includes two fan control circuits which are used to drive two parallel connected DC brush electrical motors, such as those typically used to run the radiator fans in a car engine. Each control circuit according to the preferred embodiment includes a power switching device such as a MOSFET or an IGBT, an intelligent power switching device (IPS), and an IPS control circuit.

A power module according to the present invention can provide to each electrical motor a profile of current with fixed or variable frequency and variable duty cycle. This allows for more control over the speed of the motors and thus better control over the cooling rate.

A factor that must be considered in the design of a power module is the temperature of the power switching devices during operation. MOSFETs, for example, should remain below 175° C. in order to ensure reliable performance. The temperature of the power switching devices in a module can be controlled by controlling the frequency and the duty cycle. Thus, power dissipation can be varied by manipulating these features. The frequency and the duty cycle can be varied depending on the input. The present preferred embodiment is designed around the following:

Frequency=20 Hz

Max Ambient Temp.=105° C.

Steady State Current Across Each Motor=14 Amps at 14V

Min. Duty Cycles=30%

These conditions provide a power loss that can be dissipated by the power module without compromising its reliability and functionality. A power module according to the present invention can operate at 50 Hz with few modifications to the control circuit.

The power module, which includes the dual output power circuit, includes a lead frame structure which is supported by a power shell. The lead frame includes a flat copper pattern of a relatively large area. The power switching devices are electronically and thermally connected to the flat copper pattern by, for example, soldering or a conductive epoxy. Respective IPSs for driving the power switching devices may also be connected to the flat copper pattern. Respective circuit components used in the IPS control circuits are disposed on a power circuit board (PCB). The PCB may be glued onto the flat copper pattern as well. Wire bonds may be then used for making the appropriate electrical connections between the various components. The components may then be protected by a potting compound such as a silicone gel.

A power module according to the present invention may also include a feature for detecting the status of the motors. According to the preferred embodiment, the feature for detecting the status of the motors includes a resistor connected to each motor which provide a status output representing the average speed of the electrical motors and warning when one or both are stalled.

A power module according to the present invention includes input and output leads that extend through the power shell to the exterior thereof. The portion of the leads extending outside of the power shell are connected to cables which provide appropriate electrical connections to the components within the power shell. One of the leads according to the present invention extends from an edge of the flat copper pattern through the power shell to the exterior thereof. This extension is electrically and thermally connected to a cable, which cable is connected to a terminal of a power source such as a battery. Thus, electrical power may be transferred from the power source to the power switching devices. Advantageously, the heat generated by the power switching devices may also be dissipated through the cable that is connected to the extension.

A power module according to the present invention also includes a soft, polyamide enclosure which encapsulates the power shell, the leads extending from the power shell, the components contained within the power shell, and at least those portions of wires that are connected to the leads.

In a power module according to the present invention, the flat copper pattern has a wider area than the power switching devices disposed thereon, which results in good heat dissipation due to heat spreading. The heat spreading combined with heat dissipation through the electrical cables allow for effective thermal management.

Moreover, a power module according to the present invention eliminates connector needs, thereby reducing losses incurred due to connections. In addition, because all of the electrical cables going to and coming from the electrical motors are contained within the power module, the module can be installed and removed more easily. Also, the rubbery enclosure makes the module resilient and thus resistant to vibrations, as well as light weight.

Other features and advantages of the present invention will become apparent from the following description of the invention which refers to the accompanying drawings.

DETAILED DESCRIPTION OF THE PREFERRED EMBODIMENTS

Figure 1:
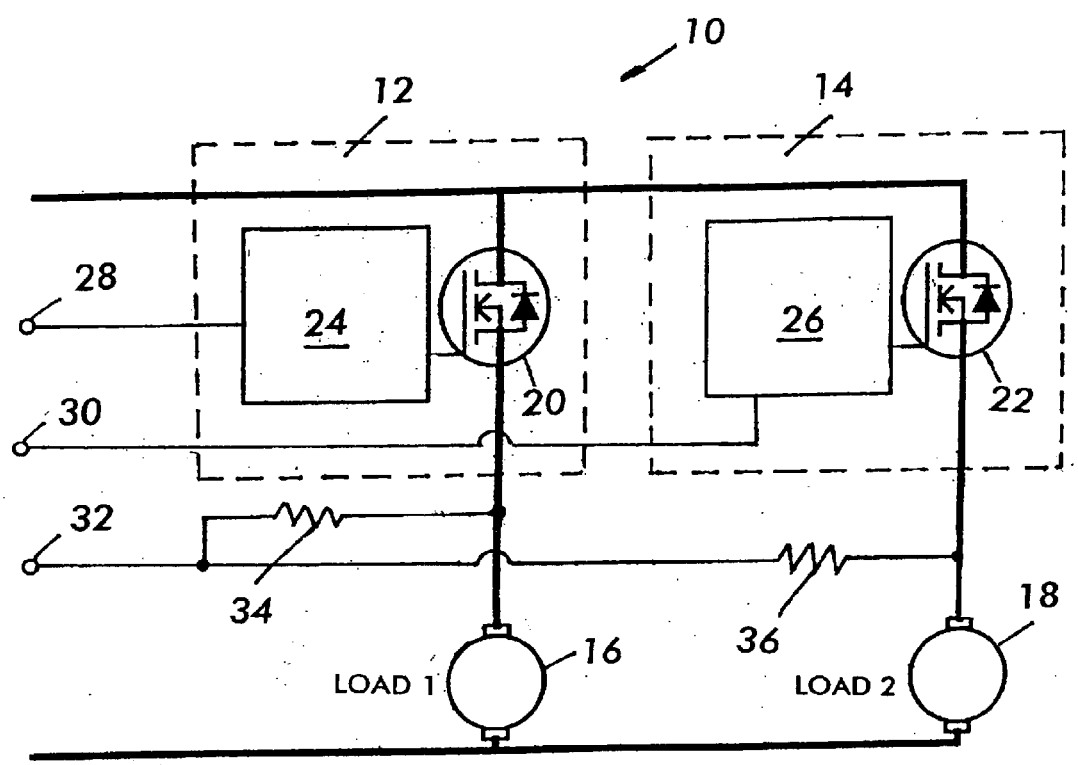
FIG. 1 is a schematic diagram of a dual output power circuit used in a power module according to the present invention.

Referring to FIG. 1, a schematic diagram of a dual output power circuit 10 which may be incorporated in a power module according to the present invention is shown. The dual output power circuit 10 includes two motor driver circuits 12, 14, each for driving a respective motor 16, 18. Each motor driver circuit 12, 14 includes a respective power switching device 20, 22 which is connected between the positive power terminal of a battery +Vbatt and a power terminal of a respective motor 16, 18. Each power switching device 20, 22 is preferably a MOS-gated device such as a power MOSFET, or IGBT. In a preferred embodiment, vertical conduction MOSFETs (GEN7) which are available from the International Rectifier may be used. Other power switching devices, such as power diodes, can also be used in a power module according to the present invention. Each power switching device 20, 22 is switched by a respective control circuit 24, 26 according to a desired frequency and for a desired duty cycle in order to vary the power delivered to each motor 16, 18. Each control circuit 24, 26 is connected to a respective input terminal which are electrically connected to respective input leads (28, 30, FIG. 2). The control circuits 24, 26 receive signals via input terminals according to which the frequency and duty cycle of the current delivered to each motor 16, 18 is controlled.

The fan control circuit 10 also may include a status terminal 32 which is connected to respective status resistors 34, 36. The status resistors 34, 36 are connected to respective motors 16, 18. The output of each status resistor 34, 36 can be used as an indicator of the performance of each motor 16, 18, for example through current sensing. The status resistors 34, 36 can also be used to determine whether one or both motors 16, 18 are stalled.

The motors 16, 18 are connected to a circuit common which is connected to the negative terminal of the battery −Vbatt.

Figure 2:
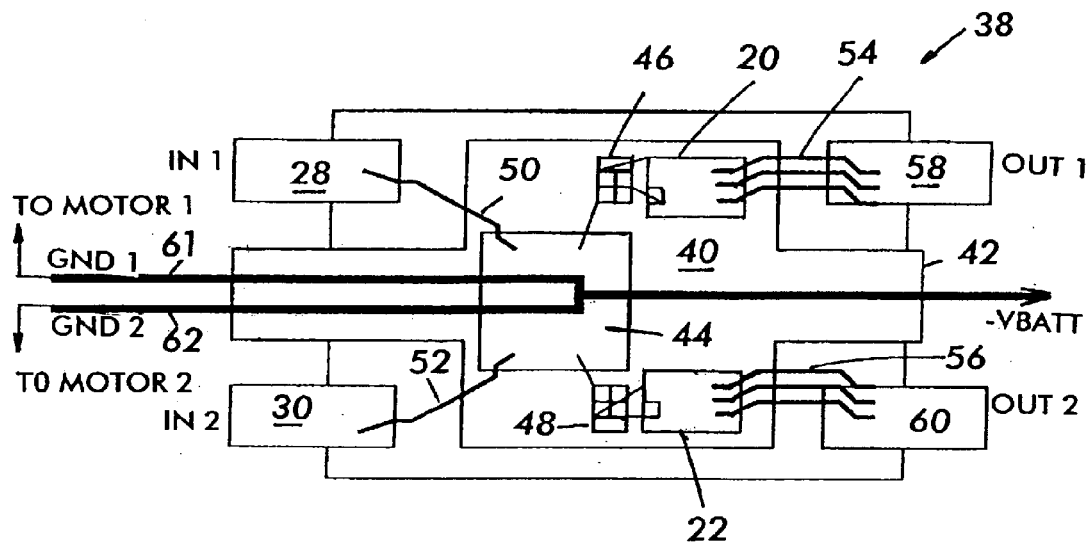
FIG. 2 is a schematic diagram of a first arrangement of components in a power module according to the present invention.

Referring now to FIG. 2, a schematic view of a first arrangement of components in a power module 38 according to the present invention is shown. A power module according to the present invention includes a lead frame comprising a large, flat pad 40 which has electrically mounted thereon power switching devices 20, 22. The pad 40 includes an extension 42. The pad 40 and the extension 42 are integrally connected so as to form a unitary body. The positive terminal of the battery +Vbatt is connected electrically to the extension 42 by a wire (not shown). The heat generated by the power switching devices 20, 22 is spread by the pad 40 and partially dissipated through the body of the power module 38. Also, the generated heat from the power switching devices 20, 22 is transferred via the extension 42 to the cable that connects the extension 42 to the positive terminal of the battery +Vbatt and is thereby dissipated by the cable. A power circuit board (PCB) 44 is disposed on the pad 40. The PCB 44 is preferably an ordinary circuit board but may also be a thermally conductive substrate such as an insulated metal substrate (IMS) which has a conductive circuit pattern formed on the top surface thereof. Intelligent power switches (IPSs) 46, 48 for switching respective power switching devices 20, 22 are disposed on the pad 40. The IPSs 46, 48 are connected to respective IPS control circuits (not shown) which are disposed on the PCB 44. The IPSs 46, 48 and their respective IPS control circuits (not shown) form the control circuits 24, 26, which are schematically shown in FIG. 1. The PCB 44 includes conductive portions which electrically connect the IPS control circuits (not shown) to respective input terminal leads 28, 30 via wire bonds 50, 52. A plurality of wire bonds 54, 56 electrically connect the terminals of the power switching devices 20, 22 to respective output terminal leads 58, 60. The output terminal leads are connected via cables to the motors (16, 18, FIG. 1). FIG. 2 also schematically shows the ground cables 60, 62 which connect the negative terminal −Vbatt of the battery and the motors (16, 18, FIG. 1).

As shown in FIG. 2, the extension 42 is disposed between input terminal leads 28, 30. Also, the input terminal leads 28, 30 and the extension 42 are disposed along one side of the pad 40, while the output terminal leads 58, 60 are disposed along an opposing side of the pad 40.

Figure 3:
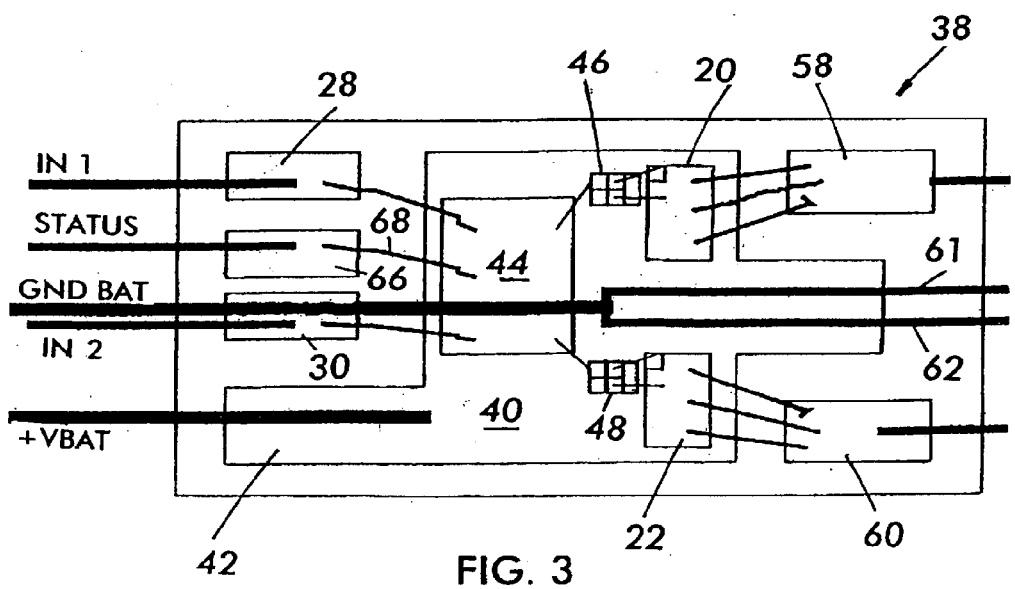
FIG. 3 is a schematic diagram of of a second arrangement of components in a power module according to the present invention.

FIG. 3 shows the schematic of a second embodiment of power module 38. A power module 38 according to the alternative arrangement includes a status terminal lead 66. The status terminal lead 66 is connected to a conductive portion on the PCB 44 via a wire bond 68. In this embodiment, status resistors (34, 36, FIG. 1) are also disposed on PCB 44. In normal operation, the voltage at the status terminal lead 66 should be at the battery voltage. To detect a failing branch, the power switching devices 20, 22 are opened successively. Also, in this embodiment, the extension 42 is extended from one corner of the pad 40 rather than being disposed between input terminal leads 28, 30.

Figure 4:
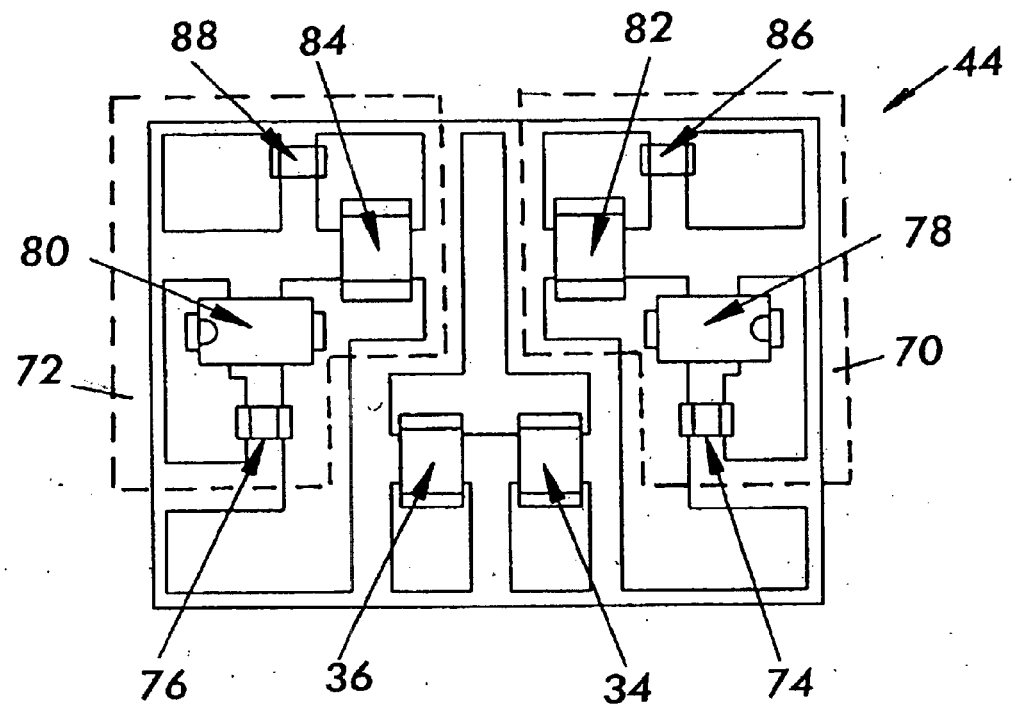
FIG. 4 shows a power circuit board having disposed thereon an IPS control circuit according to a first configuration.

FIG. 4 shows the PCB 44 having disposed thereon the status resistors 34, 36, and the various components for the IPS control circuits 70, 72. The status resistors 34, 36 are preferably 0.5 W, 15K ohm resistors. Each IPS control circuit preferably includes a 22 nF capacitor 74, 76 parallel connected with a 40V zener diode 78, 80. This parallel configuration is series connected with a 60V Schottky diode 82, 84. Each Schottky diode 82, 84 is series connected with a respective input resistor 86, 88 which are in turn electrically connected to the input terminal leads (28, 30, FIG. 2 and FIG. 3).

Figure 5:
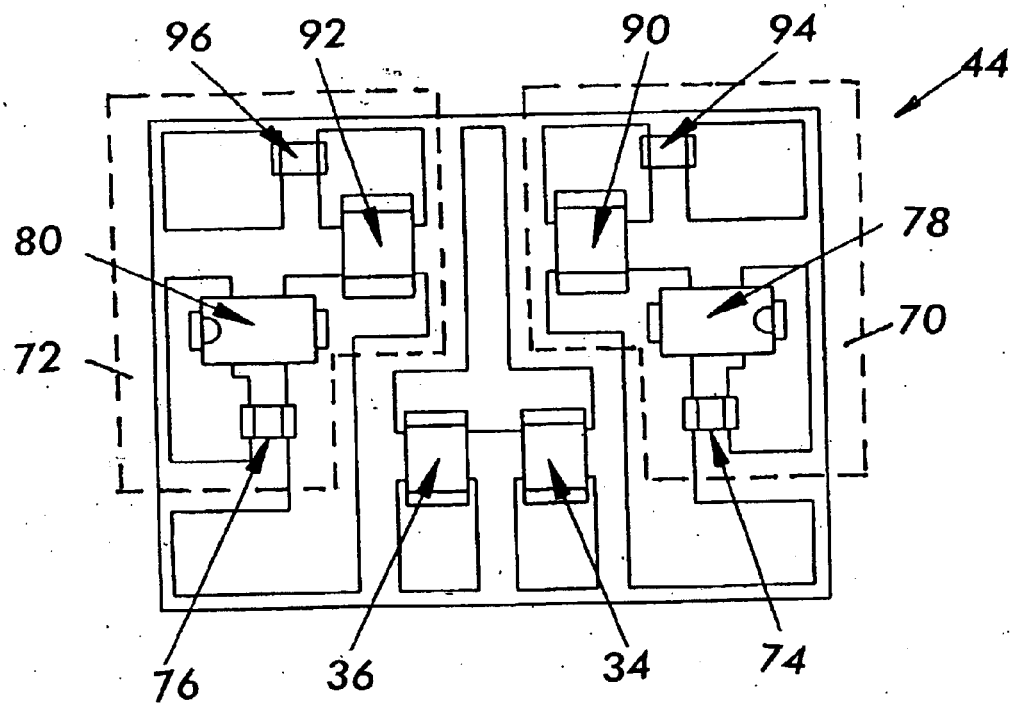
FIG. 5 shows a power circuit board having disposed thereon an IPS control circuit according to a second configuration.

FIG. 5 shows a PCB 44 according to an alternative embodiment. In this embodiment the 60V Schottky diodes (82, 84, FIG. 4) are replaced with 1 W 100 ohm resistors 90, 92 and the input resistors (86, 88, FIG. 4) are replaced with jumpers 94, 96.

The capacitors act as an input filter and for anti-bounce, and the zener diodes act as an active clamps. If desired these components may be included in the IPS control circuits.

Figure 6:
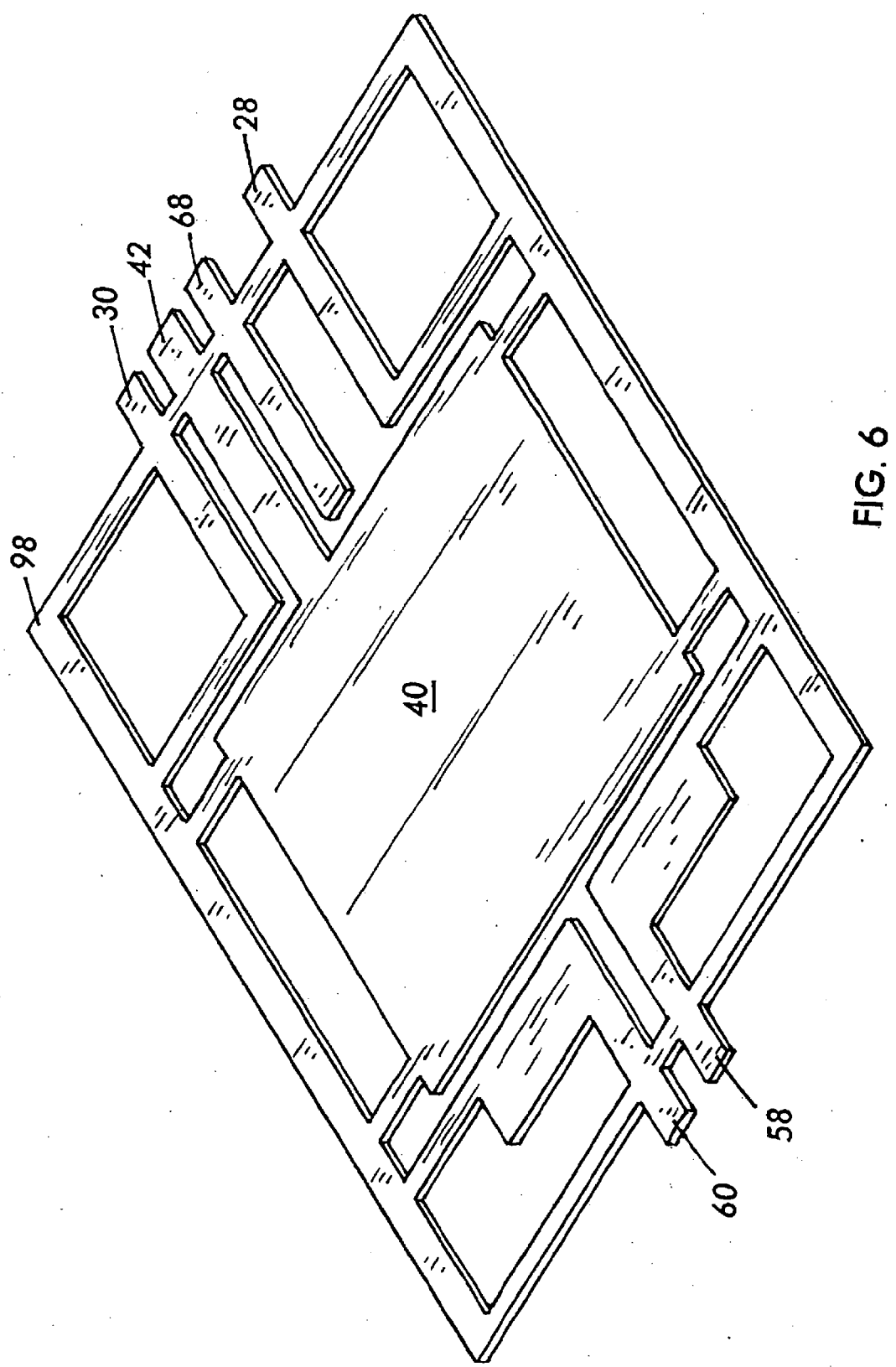
FIG. 6 shows a blank lead frame used in the making of a power module according to the present invention.

A power module according to the present invention is assembled as follows. A blank lead frame 98 as shown in FIG. 6 is first provided. The blank lead frame is substantially flat and is preferably made of a copper plate of approximately 1 mm of thickness. The blank lead frame 98 includes a pad 40 having an extension 42 extending from an edge thereof. The pad has substantially the same thickness as the remainder of the blank lead frame. The terminal leads, namely, the input terminal leads 28, 30, the status terminal lead 68, and the output terminal leads 58, 60 are disposed near an edge of the pad 40 without making contact with the same.

Figure 7:
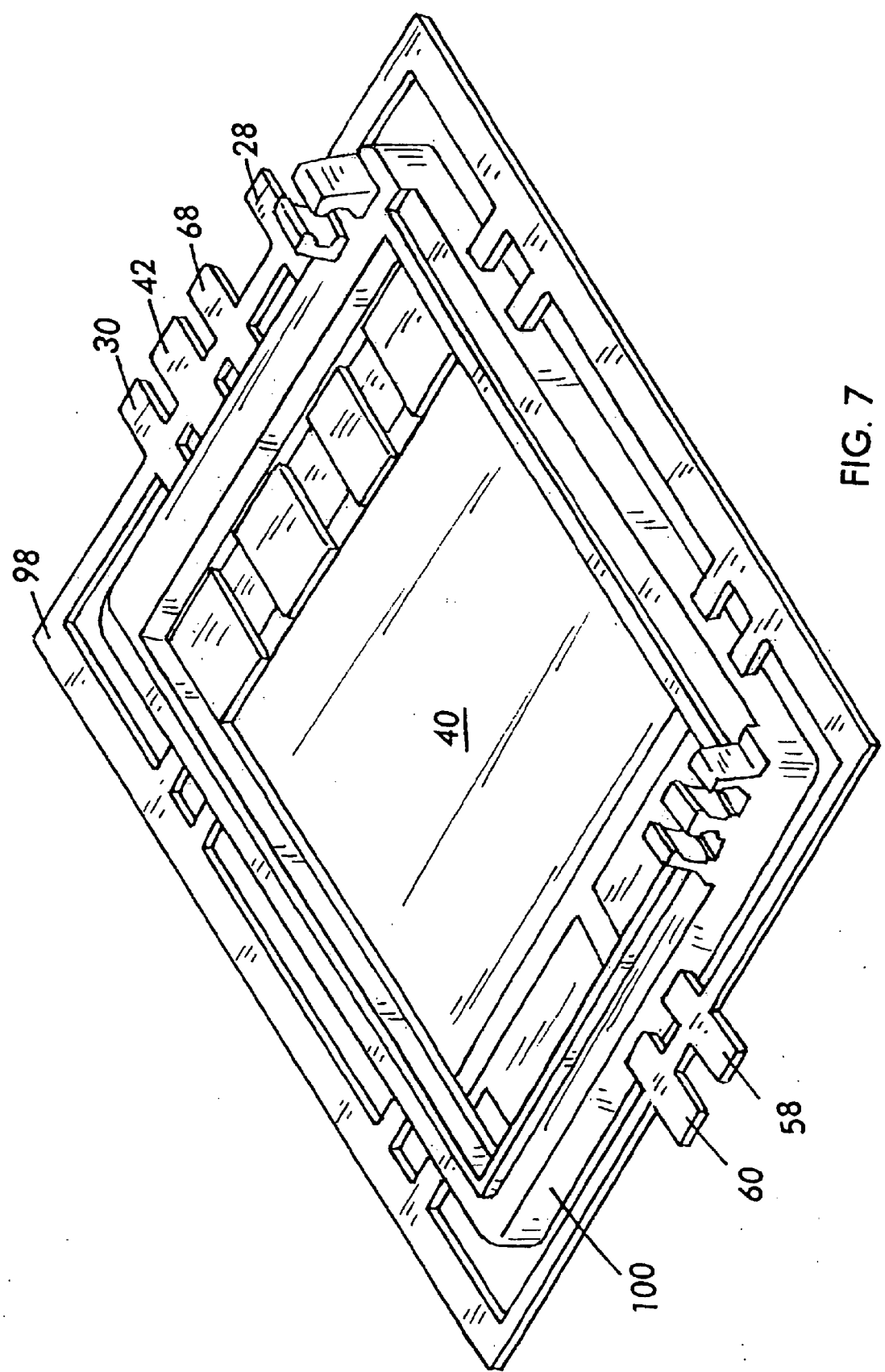
FIG. 7 shows the blank lead frame shown in FIG. 6 as embedded in a power shell.
Figure 8:
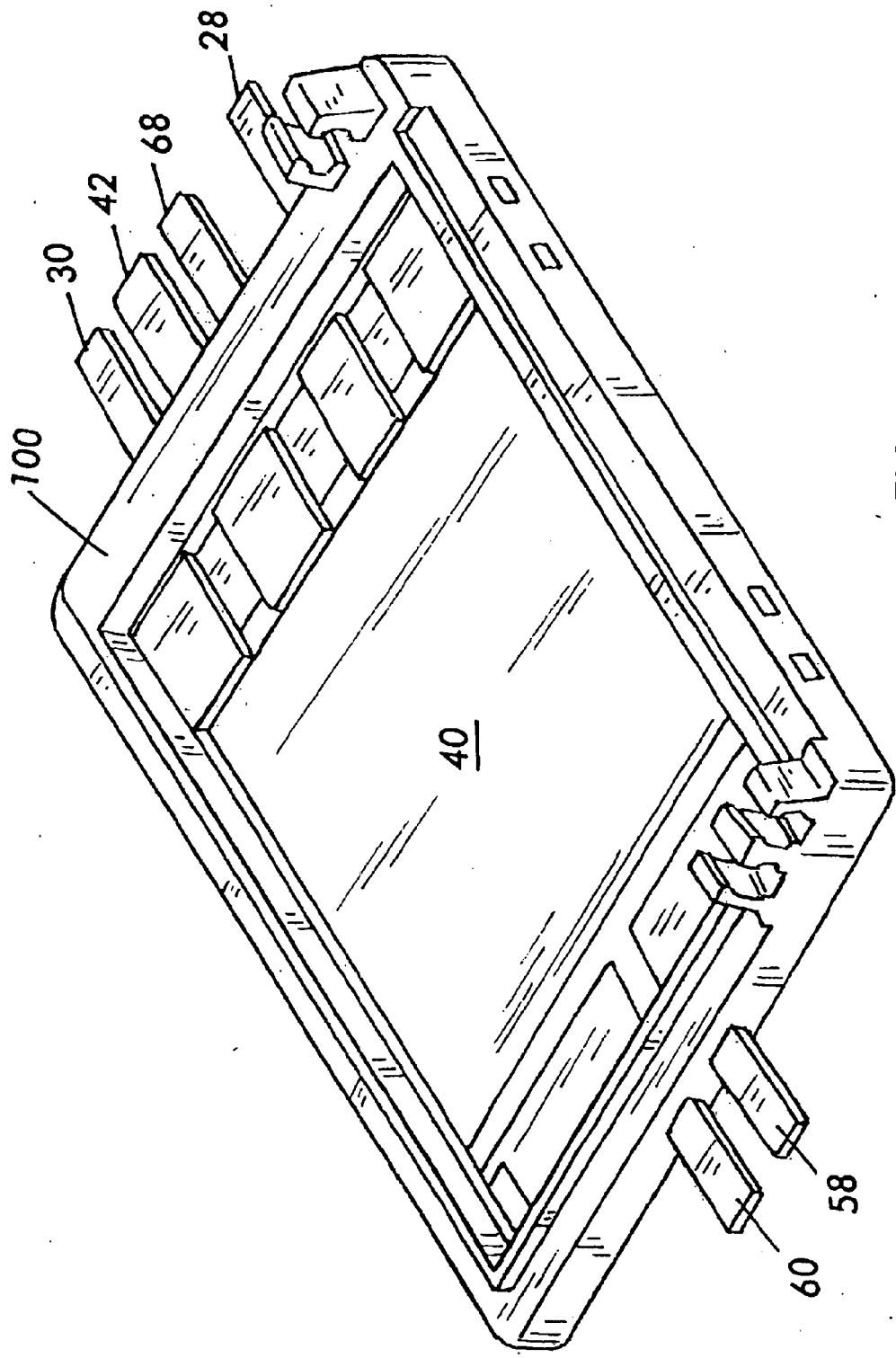
FIG. 8 shows the blank lead frame as embedded in a power shell according to FIG. 7 after the lead frame has been trimmed in the making of a power module according to the present invention.

Next, a power shell 100 is formed around the lead frame by for example a molding process so as to support the various leads and the power input pad 40 as shown in FIG. 7. The electrical components forming the dual output power circuit are preferably all disposed within the power shell 100 once it is formed. The power shell 100 is formed so that the terminal leads (28, 30, 58, 60, 68) and the extension 42 extend through the walls of the power shell 100 thus providing a means for electrical connection to the components contained therein. Next, the excess portions of the blank lead frame 98 are trimmed, thus separating the terminal leads (28, 30, 58, 60, 68) and the extension 42 from one another as shown in FIG. 8.

Figure 9:
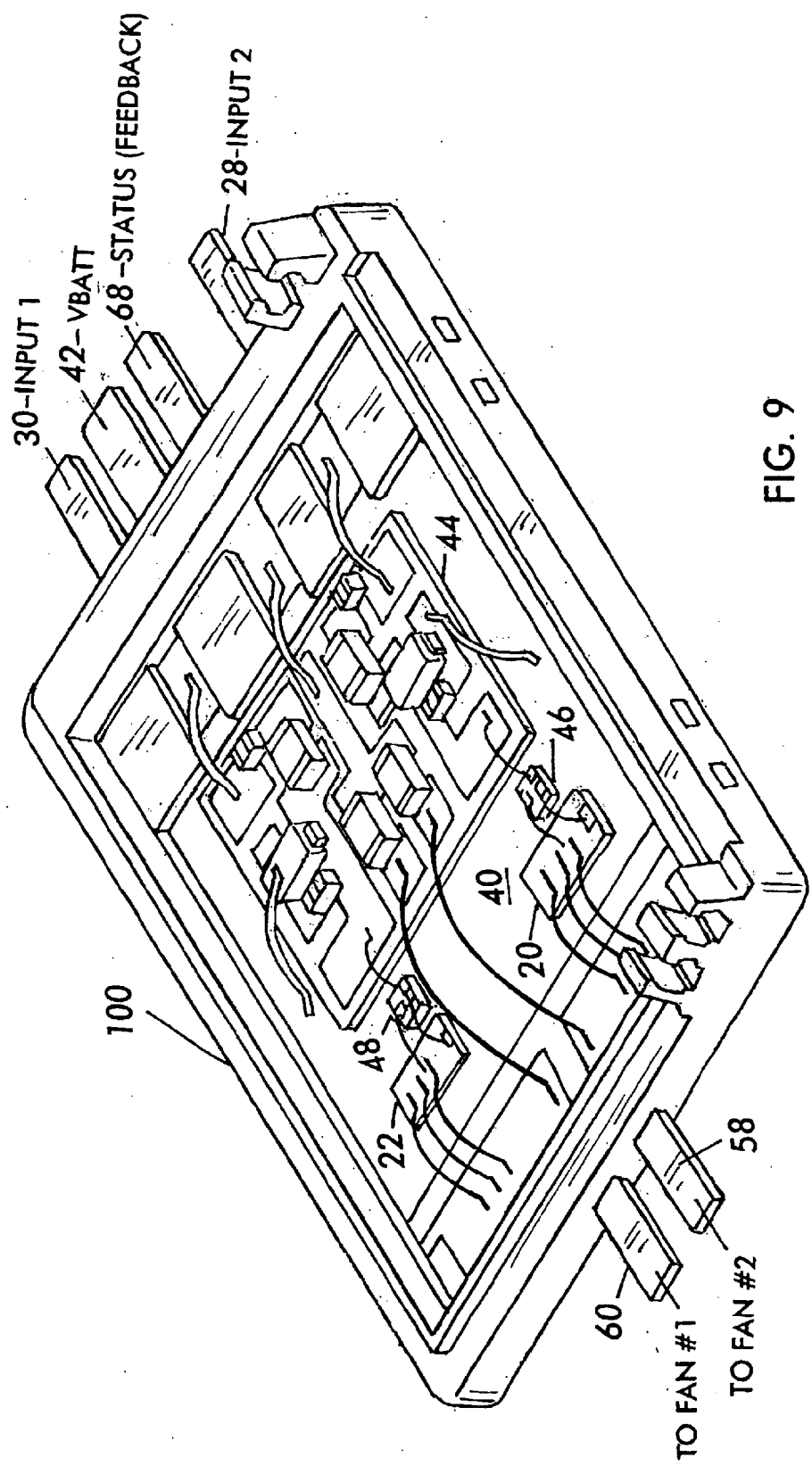
FIG. 9 shows the various components of a power module according to the present invention disposed within the power shell.
Figure 10:
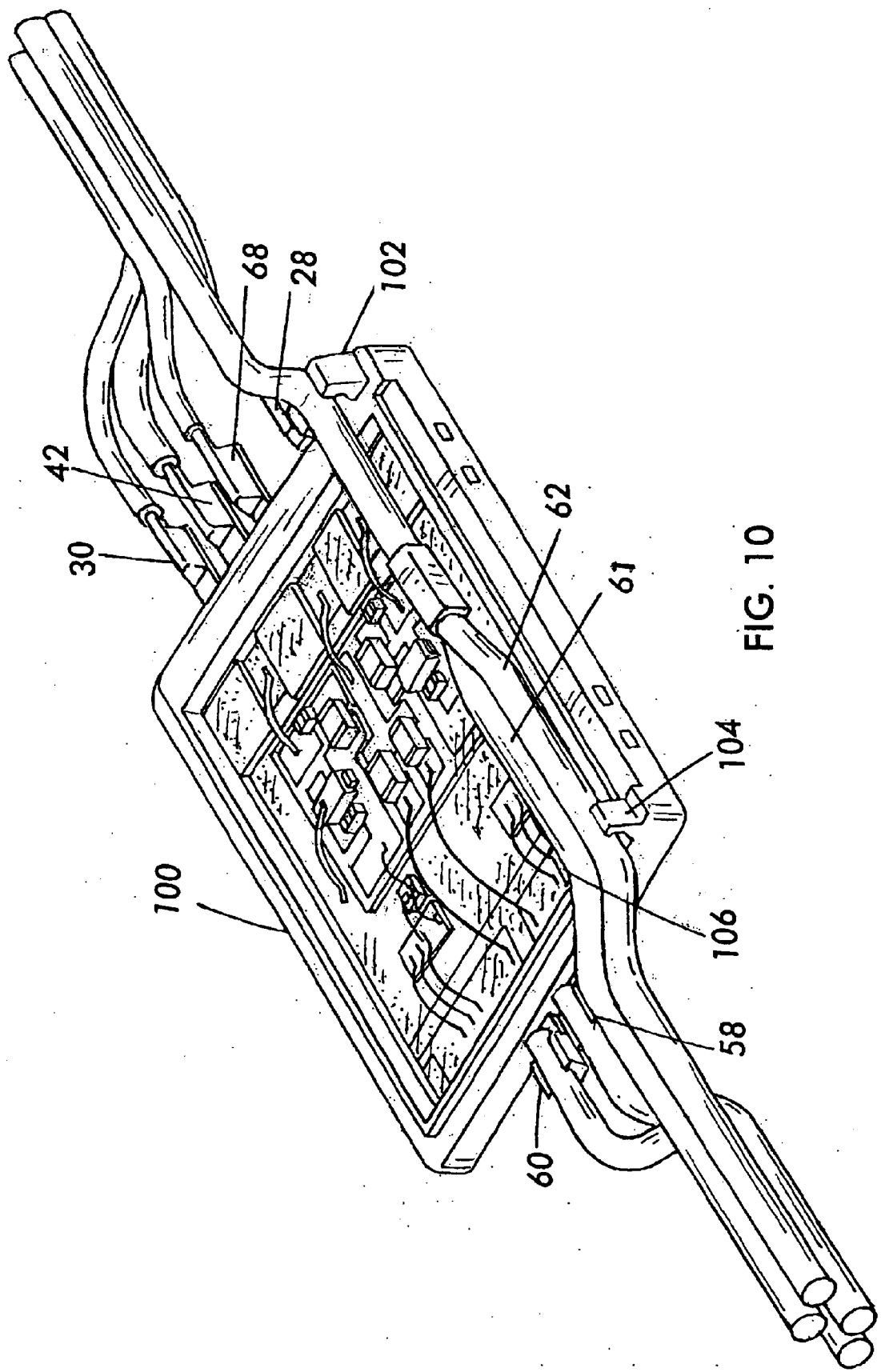
FIG. 10 shows the various components of the power module according to the present invention covered by potting compound during the making of the power module.

Next, as shown in FIG. 9, the power switching devices 20, 22, the IPSs 46, 48 and the PCB 44 are placed on the pad 40. The PCB 44 is preferably glued onto the pad 40, while the power switching devices 20, 22 and the IPSs 46, 48 are thermally and electrically connected to the pad 40 by for example a conductive epoxy. Bonding wires are then used to make the appropriate electrical connections to the terminal leads. Potting compound may be then deposited over the circuit arrangement within the power shell 100 as shown in FIG. 10. Alternatively, a COPACK that includes the IPS and the power switching device may be used to protect the power switching devices from environmental damage caused by for example humidity, thus omitting the need to use a potting compound. As a further alternative, dies on a thick (1 mm) copper substrate could also be used. This may, however, increase the cost of wiring and possibly the size of the driver.

As shown in FIG. 10, the power shell 100 may include two or more wire posts 102, 104, 106. The wire posts may be disposed on the corners of the power shell 100. The wire posts 102, 104, 106 receive the ground wires 61, 62 and secure the same to the power shell 100.

Figure 11:
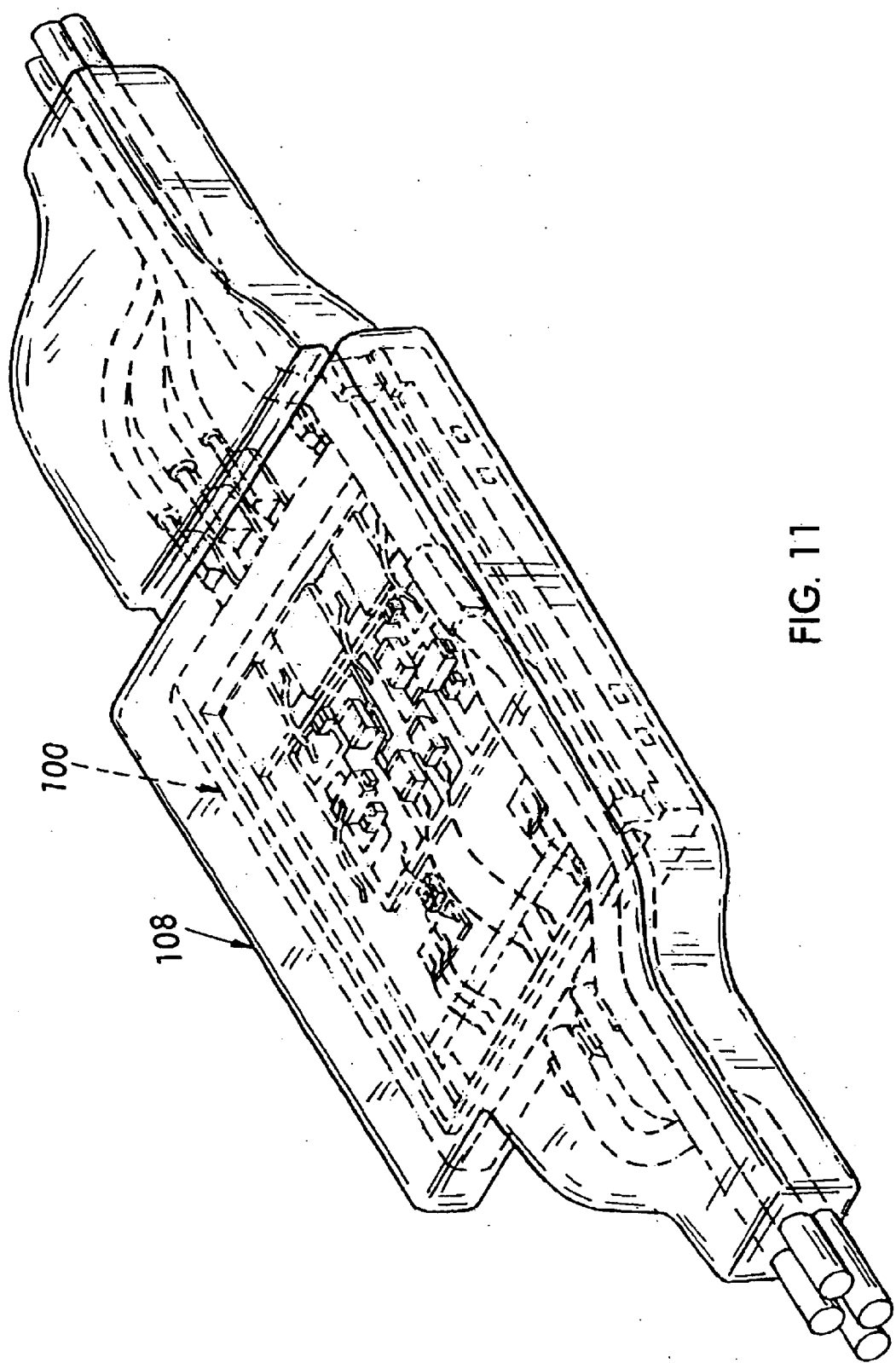
FIG. 11 shows the arrangement shown in FIG. 10 encapsulated by an enclosure.

Cables are also connected to the leads 28, 30, 58, 60, 68 and the extension 42. The entire arrangement as shown in FIG. 10 is then encapsulated in an insulating polyimide compound as schematically shown in FIG. 11. This provides for an insulated and flexible enclosure 108 for the power module. As shown in this figure the cables, which constitute the harness, are partially enclosed by the enclosure 108 and extend out from the same.

To ensure optimum operability of the power module, full $R_{TH}$ must be in the range of 20 to 30° C./W, which will also protect the motor and the harness. Also preferably no connectors should be used since it would increase losses and reduce cooling via wires. The harness in a module according to the present invention is integrated with the module which reduces cost (fewer connectors) and improves reliability.

By placing the module in the path of the air flow from the fan further cooling of the module may be accomplished. Depending on the application, however, air flow to cool the module may not be necessary.

If a COPACK is used its structure may include:
Co-pack with 2 mils and 20 mils wires.
Driver=IPSXX
Mosfet=GEN7 40V 165 mm by 303 mm Hex 4.5 with current sense;
2.5 mOhm 40V in Super 220

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power module comprising:
    a lead frame, said lead frame including an electrically conductive pad;
    a shell;
    a plurality of lead terminals extending from within said shell to the exterior of said shell, at least one of said leads serving as a power input lead and electrically connected to said conductive pad, at least another one of said leads serving as a first power output lead and at least a third one of said leads serving as a second power output lead;
    a circuit board disposed on a first surface of said electrically conductive pad; and at least two power switching devices electrically connected to said first surface of said conductive pad;
    wherein said power switching devices and said circuit board are disposed side-by-side on said conductive pad, each power switching device is electrically connected to a respective one of said first power output lead and said second power output lead, and said first power output lead is adapted to supply power to a first load, and said second power output lead is adapted to supply power to a second load, said first load and said second load being independently operable devices.

2. A power module according to claim 1, wherein at least one of said power input lead is integral with said conductive pad.

3. A power module according to claim 1, wherein said shell surrounds said conductive pad.

4. The power module of claim 1, wherein said shell and said lead frame are encapsulated by an insulated and flexible enclosure.

5. The power module of claim 1, wherein potting compound is disposed within said shell.

6. The power module of claim 1, further comprising a control circuit for each said power switching device is disposed within said shell.

7. The power module of claim 1, further comprising a status resistor disposed within said shell and electrically connected to a respective power output lead.

8. The power module of claim 4, wherein said enclosure comprises polyamide.

9. The power module of claim 6, wherein each control circuit includes an intelligent power switch and a circuit that controls said intelligent power switch.

10. The power module of claim 9, wherein each said intelligent power switch is disposed on said electrically conductive pad, and said circuit that controls said intelligent power switch is disposed on said circuit board.

* * * * *